(12) United States Patent
Hwang et al.

(10) Patent No.: US 6,423,648 B2
(45) Date of Patent: Jul. 23, 2002

(54) CONTROLLABLE OXIDATION TECHNIQUE FOR THE FORMATION OF HIGH-QUALITY ULTRA-THIN GATE OXIDE USING CARBON DIOXIDE AS THE OXIDIZING AGENT

(75) Inventors: Ming Hwang, Dallas; Paul Tiner, Plano; Sunil Hattangady, McKinney, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/737,647

(22) Filed: Dec. 14, 2000

Related U.S. Application Data

(63) Continuation of application No. 09/349,625, filed on Jul. 8, 1999.
(60) Provisional application No. 60/097,984, filed on Aug. 26, 1998.

(51) Int. Cl.[7] .............................................. H01L 21/336
(52) U.S. Cl. ........................ 438/770; 438/197; 438/695
(58) Field of Search ................................. 438/770, 706, 438/197, 695, 585

(56) References Cited

U.S. PATENT DOCUMENTS

| | | | |
|---|---|---|---|
| 5,173,152 A | * | 12/1992 | Tanaka |
| 5,376,223 A | * | 12/1994 | Salimian et al. |
| 5,422,289 A | * | 6/1995 | Pierce |
| 5,631,199 A | * | 5/1997 | Park |
| 5,693,578 A | * | 12/1997 | Nakanishi et al. |
| 5,846,321 A | * | 12/1998 | Habuka et al. |
| 5,851,892 A | * | 12/1998 | Lojek et al. |
| 5,940,736 A | * | 8/1999 | Brady et al. |
| 6,037,273 A | * | 3/2000 | Gronet et al. |
| 6,066,519 A | * | 5/2000 | Gardner et al. |

OTHER PUBLICATIONS

Gaind, et al., "Preparation and Properties of $SiO_2$ Films from $SiH_4$–$CO2$–$H_2$", Jan. 1976 J. Electrochem, Soc: Solid–State Science and Technology, pp. 111–117.

* cited by examiner

Primary Examiner—Chandra Chaudhari
Assistant Examiner—Stephen W. Smoot
(74) Attorney, Agent, or Firm—Jacqueline J. Garner; W. James Brady, III; Frederick J. Telecky, Jr.

(57) ABSTRACT

A method of forming an ultra-thin gate oxide (14) for a field effect transistor (10). The gate oxide (14) is formed by combining an oxidizing agent (e.g., $N_2O$, $CO_2$) with an etching agent (e.g., $H_2$) and adjusting the partial pressures to controllably grow a thin (~12 Angstroms) high quality oxide (14).

14 Claims, 2 Drawing Sheets

CONTROLLABLE OXIDATION TECHNIQUE FOR THE FORMATION OF HIGH-QUALITY ULTRA-THIN GATE OXIDE USING CARBON DIOXIDE AS THE OXIDIZING AGENT

This is a continuation of Application Ser. No. 09/349,625, filed Jul. 8, 1999 which claims priority under 35 U.S.C. §119(e) of provisional application No. 60/097,984, file Aug. 26, 1998.

FIELD OF THE INVENTION

The invention is generally related to the field of forming MOSFET transistors and more specifically to a method of forming an ultra-thin gate oxide.

BACKGROUND OF THE INVENTION

Presently, there is a great demand for shrinking semiconductor devices to provide an increased density of devices on the semiconductor chip that are faster and consume less power. The scaling of devices in the lateral dimension requires vertical scaling as well so as to achieve adequate device performance. This vertical scaling requires the effective electrical thickness of the gate dielectric to be reduced so as to provide the required device performance.

Silicon dioxide has been the preferred gate dielectric material. Traditional methods of reducing the silicon dioxide thickness involve one or more of the following: reduce the oxidation temperature; change the oxidation gas; or dilute the oxidation gas. Reducing the oxidation temperature has the disadvantage of degrading the GOI (gate-oxide integrity). Due to GOI problems and safety (some oxidizing agents being more explosive, reactive, toxic than others), the newer technologies are quickly reaching the limits of the traditional process by requiring effective thicknesses of the silicon dioxide below 20 Angstroms.

One prior art method investigated silicon dioxide deposited using chemical vapor deposition (CVD). $SiH_4$, $CO_2$, and $H_2$ where combined to form silicon dioxide layer suitable for use in field oxidation. Combining $SiH_4$; $CO_2$, and $H_2$ allowed silicon dioxide to be formed without consuming the underlying silicon. In one experiment, 1.2% $CO_2$ in 110 liters/min $H_2$ at 1000° C. for 1 hr produced 15 Å of $SiO_2$ and 1.2% $N_2O$ in 110 liters/min. $H_2$ at 1000° C. for 1 hr produced 600 Å of $SiO_2$.

SUMMARY OF THE INVENTION

A method of forming an ultra-thin gate oxide for a field effect transistor is disclosed herein. The gate oxide is formed by combining an oxidizing agent with an etching agent and adjusting the partial pressures to controllably grow a thin high quality oxide.

An advantage of the invention is providing a thin (<20 Angstroms) high-quality gate oxide.

This and other advantages will be apparent to those of ordinary skill in the art having reference to the specification in conjunction with the drawings.

DETAILED DESCRIPTION OF THE EMBODIMENTS

Figure 1:
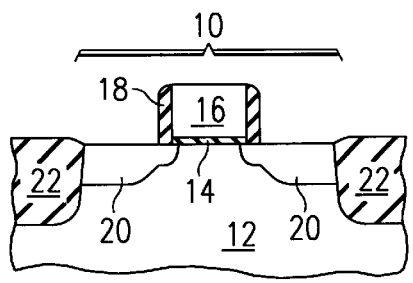
FIG. 1 is a cross-sectional diagram of a MOSFET transistor having an ultra-thin gate oxide according to the invention.

The gate oxide according to the invention will now be described in conjunction with a standard field effect transistor as shown in FIG. 1. It will be apparent to those of ordinary skill in the art that the gate oxide according to the invention may equally be applied to other types of field effect transistors such as those having raised source/drains, pocket implants, dual sidewall spacers, etc.

Transistor 10 is formed on a semiconductor wafer 12. Typically, wafer 12 will comprise silicon. A thin gate oxide 14 is located on wafer 12. Gate oxide 14 according to the invention may have a thickness less than 20 Angstroms (for example, on the order of 10–12 Angstroms). Gate electrode 16 is located over gate oxide 14. Gate electrode 16 typically comprises polysilicon. However, other gate materials such as metals, may alternatively be used. Sidewall spacers 18 are located on the sidewalls of gate electrode 16. Source and drain regions 20 are located in wafer 12 on opposite sides of gate electrode 16. Isolation regions 22 isolate transistor 10 from other transistors (not shown).

Figure 2:
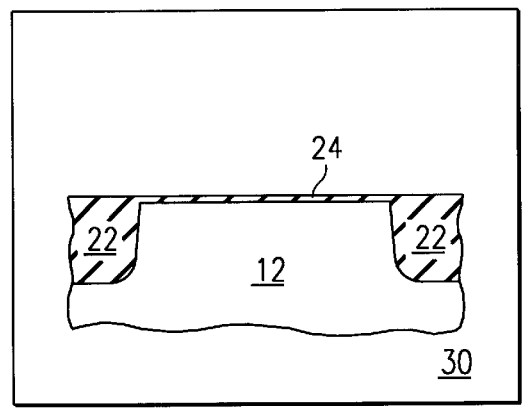
FIGS. 2–5 are cross-sectional diagrams of the MOSFET of FIG. 1 at various stages of fabrication.

A method for forming the invention will now be discussed with reference to FIGS. 2–5. Referring to FIG. 2, wafer 12 is processed through the formation of isolation regions 22 including any threshold adjust implants as is well known in the art. Wafer 12 is placed in a processing chamber 30. The term processing chamber is used broadly and may, for example, include a furnace chamber or a single wafer RTP chamber. At this time, wafer 12 will invariably have a layer of native or chemical oxide 24 formed thereover. Native oxide layer 24 forms on wafer 12 when wafer 12 is exposed to air. (For example, when wafer 12 is being transferred between processing chambers.) A chemical oxide is formed when the wafer is processed through a wet chemical surface preparation sequence.

Figure 3:
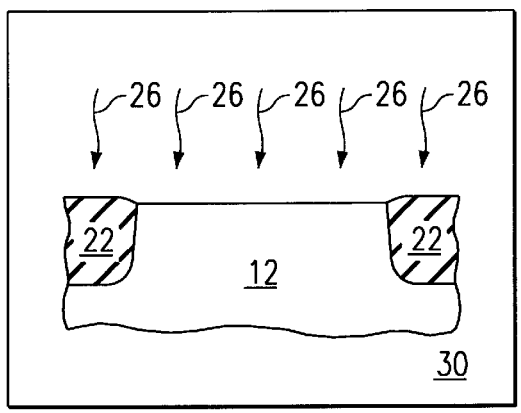

Referring to FIG. 3, wafer 12 is first exposed to an etching agent 26 to remove native oxide layer 24. In the preferred example, the etching agent 26 comprises hydrogen. For example, the etching agent 26 may be pure hydrogen or it may be a forming gas (e.g., 90%$N_2$/10%$H_2$). Other etching agents such as fluorine or chlorine may be used. However, there are safety cuncerils with using fluorine and chlorine.

Figure 4:
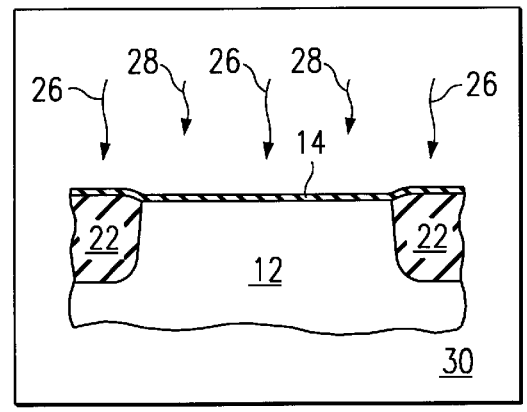

Once native oxide layer 24 is removed, an oxidizing agent 28 is introduced to the chamber 30. At this point in the process, both the etching agent 26 and the oxidizing agent 28 are being introduced to the chamber 30, as shown in FIG. 4. The partial pressures of the etching and oxidizing agents are adjusted to obtain a slow growth of oxide 14. The flow rates, temperature and pressure may vary depending on the oxidizing and etching agents used. They are chosen based on free energy calculations known in the art. Safety should be considered when choosing an oxidizing agent as some oxidizing agents tend to be more explosive than others, especially in the presence of hydrogen. Examples of oxidizing agents include $CO_2$, $N_2O$, and $O_2$.

Slow growth rate can be achieved even using higher temperatures. For example, temperatures greater than 800° C. may be used. The ability to use higher temperatures improves GOI. In prior art techniques, these higher temperatures caused an oxidation growth rate too large to controllably form thin oxides. Thus, the temperature was reduced and GOI suffered. However, combining the oxidizing and etching agents, as in the present invention, slows the growth rate down considerably allowing for the use of higher temperatures.

By using both oxidizing and etching agents, the process can both grow and etch simultaneously. This has two main advantages. First, the overall growth rate slows down and becomes more controllable even for very thin oxides (<20 Angstroms). Second, sub-oxides and defects can be removed as the oxide layer is being formed. If desired, the relative gas flows of the oxidizing and etching agents can be altered during the process to alternate between a mainly etching phase and a mainly growing phase.

In one embodiment of the invention, $CO_2$ is used as the oxidizing gas and $H_2$ is used as the etching agent. The process is performed in a furnace. Alternatively, a rapid thermal process (RTP) chamber could be used. In this embodiment, $H_2$ is supplied in a forming gas that is 90% $N_2$ and 10% $H_2$. Diluting the $H_2$ can make the process safer to work with. However, pure $H_2$ could alternatively be used. $CO_2$ is supplied at a gas flow rate of 0.5 liters/min. $H_2$ is supplied at 1.0 liters/min and $N_2$ is supplied at 9.0 liter/min. A temperature of 850° C. is used. Alternative temperatures typically range from 700 to 1050° C. in a furnace. (RTP temperatures typically range from 750 at to 1200° C.) In this embodiment, the pressure remains at atmospheric pressure. However, a low pressure RTP process (~50–400 torr) could alternatively be used.

Figure 6:
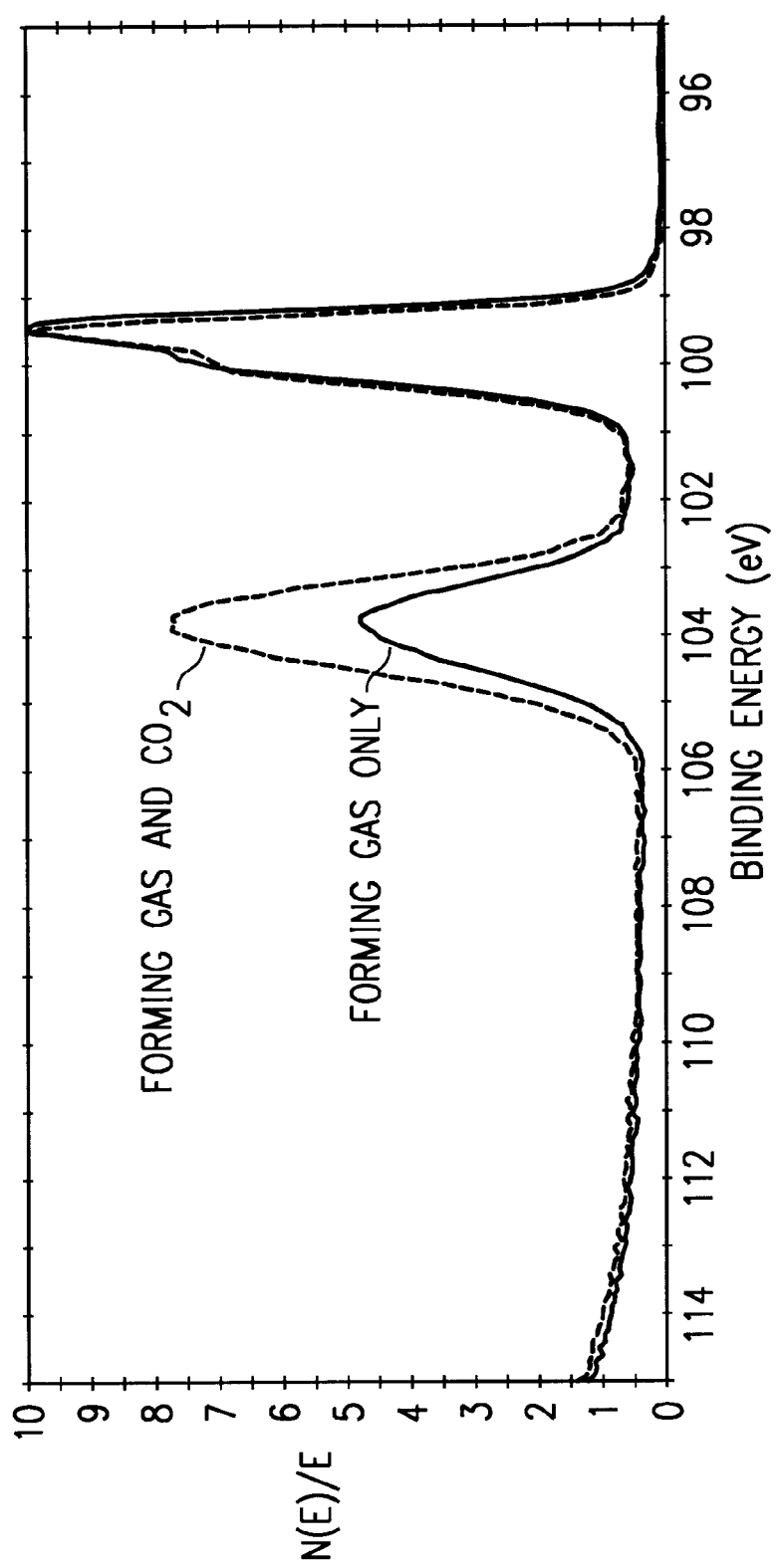
FIG. 6 is a graph of binding energy indication SiO2 bonding with no carbon or nitrogen detected.

The above process results in a very slow oxidation rate. In addition to the oxidizing/etching mechanism, oxidation is slowed due to a high activation of $H_2O$. An XPS (X-ray photoelectron spectroscopy) indicated the $SiO_2$ bonding with no carbon or nitrogen detected (see, FIG. 6). After 30 minutes in the furnace, 10 Å of silicon dioxide is formed. After 60 minutes, the thickness of the silicon dioxide increased to 12 Å. This indicates a very easily controlled process. Of course, a RTP process would have a significantly reduced duration and higher temperatures.

In another embodiment of the invention, $N_2O$ is used as the oxidizing gas and $H_2$ is used as the etching agent. The process is performed in a RTP single wafer processor. Alternatively, a furnace could be used. In this embodiment, $H_2$ is supplied in either a forming gas or pure $H_2$. $N_2O$ is supplied at a gas flow rate on the order of 10–100 sccm. $H_2$ is supplied at a gas flow rate on the order of 2 liters/min in an $N_2$ ambient (e.g., 90%$N_2$,10% $H_2$). A temperature in the range of 800–1200° C. may be used. In this embodiment, a low pressure RTP (~50–400 torr) process may be used. As a result a very slow oxidation rate with a controliabie $H_2O$ formation is obtained.

Figure 5:
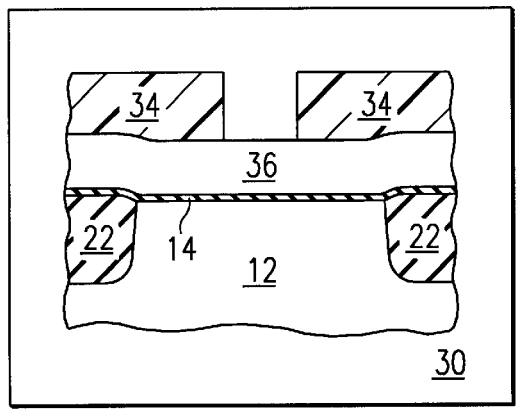

After thin gate oxide 14 is formed, a conductive material 36 for gate electrode 16 is deposited, as shown in FIG. 5. A gate pattern 34 is then formed over conductive material 36. Conductive material 36 and gate oxide 14 are then etched to form gate electrode 16 as shown in FIG. 1. Processing then continues as is known in the art to form drain extensions, sidewall spacers, 18 and source and drain regions 20.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

What is claimed is:

1. A method of forming a gate oxide for a field effect transistor on a wafer, comprising the steps of:

placing said wafer in a processing chamber; and introducing a first etching agent with an oxidizing agent to said chamber to form said gate oxide by simultaneous growth and etch of the gate oxide, wherein said oxidizing agent comprises carbon-dioxide.

2. The method of claim 1, wherein said first etching agent is $H_2$.

3. The method of claim 1, wherein said oxidizing agent is introduced at a flow rate on the order of 0.5 liters/min and said first etching agent is introduced at a flow rate on the order of 1.0 liters/min $H_2$ and 9.0 liters/min $N_2$.

4. The method of claim 1, further comprising the step of raising the temperature of said chamber to on the order of 850° C. prior to said step of introducing the first etching agent.

5. The method of claim 1, further comprising the step of adjusting the pressure of said chamber to on the order of 50–400 torr prior to said step of introducing the first etching agent.

6. The method of claim 1, further comprising the step of introducing a second etching agent to said chamber prior to said introducing said first etching agent step.

7. The method of claim 6, wherein said second etching agent is the same as said first etching agent.

8. A method of forming an integrated circuit comprising the steps of:

forming a gate oxide for a field effect transistor on a wafer, comprising the steps of:
placing said wafer in a processing chamber;
supplying both an etching agent and an oxidizing agent to said chamber to form said gate oxide by simultaneous growth and etch of the gate oxide, wherein said oxidizing agent comprises carbon dioxide;

forming a gate electrode over said gate oxide; and forming source and drain regions in said wafer adjacent said gate electrode.

9. The method of claim 8, wherein said etching agent is $H_2$.

10. The method of claim 8, wherein said etching agent comprises a forming gas.

11. The method of claim 8, wherein said oxidizing agent is introduced at a flow rate on the order of 0.5 liters/min and said etching agent is introduced at a flow rate on the order of 1.0 liter/min $H_2$ and 9.0 liters/min $N_2$.

12. The method of claim 8, further comprising the step of raising the temperature of said chamber to on the order of 850° C. prior to said supplying both said etching agent and said oxidizing agent step.

13. The method of claim 8, further comprising the step of adjusting the pressure of said chamber to on the order of 50–400 torr prior to said supplying both said etching agent and said oxidizing agent step.

14. The method of claim 8, further comprising the step of supplying said etching agent to said chamber to remove any native oxide on a surface of said wafer prior to said supplying both step.

* * * * *